United States Patent [19]
Gaultier

[11] Patent Number: 5,796,653
[45] Date of Patent: Aug. 18, 1998

[54] CIRCUIT FOR THE SELECTION OF REDUNDANT MEMORY ELEMENTS AND FLASH EEPROM MEMORY COMPRISING SAID CIRCUIT

[75] Inventor: Jean-Marie Gaultier, Rousset, France

[73] Assignee: SGS-Thomson Microelectronics, S.A., Gentilly, France

[21] Appl. No.: 394,314

[22] Filed: Feb. 22, 1995

[30] Foreign Application Priority Data

Feb. 23, 1994 [FR] France ................................. 94 02304

[51] Int. Cl.$^6$ .................................................. G11C 11/34
[52] U.S. Cl. ............................ 365/185.09; 365/185.12; 365/200
[58] Field of Search ........................... 365/200, 185.09, 365/185.12

[56] References Cited

U.S. PATENT DOCUMENTS 5,034,925  7/1991  Kato .
5,265,055  11/1993  Horiguchi et al. .................... 365/200
5,281,868  1/1994  Morgan .

FOREIGN PATENT DOCUMENTS

0383452  8/1990  European Pat. Off. .
2254173  9/1992  United Kingdom .

*Primary Examiner*—A. Zarabian
*Attorney, Agent, or Firm*—Allen, Dyer, Doppelt, Milbrath & Gilchrist, P.A.

[57] ABSTRACT

In order to carry out the automatic selection of redundant memory elements (rows or columns) to replace defective elements, the addresses of the elements to be replaced are compared with the current address. In order to improve the reliability by reducing the number of non-volatile memory cells normally containing the addresses of the elements to be replaced, the selection circuit has means to compute certain of these addresses from an actually stored address. Application notably to FLASH EEPROMs.

14 Claims, 4 Drawing Sheets

CIRCUIT FOR THE SELECTION OF REDUNDANT MEMORY ELEMENTS AND FLASH EEPROM MEMORY COMPRISING SAID CIRCUIT

CROSS-REFERENCE TO RELATED APPLICATION

This application claims priority from French App'n 94-02304, filed Feb. 23, 1994, which is hereby incorporated by reference. However, the content of the present application is not necessarily identical to that of the priority application.

BACKGROUND AND SUMMARY OF THE INVENTION

The invention pertains chiefly to the field of electrically erasable non-volatile integrated circuit memories and relates more particularly to FLASH EEPROM type memories.

Usually, these memories are commercially available for a given capacity, for example 16 megabits for a FLASH EEPROM. Now, the methods used to manufacture integrated circuits very often give rise to defects, notably defects that affect memory cells. Hence, to avoid having an excessively large number of rejects, the manufacturers of these circuits make provision for a certain number of redundant cells designed to replace the defective cells if necessary.

These memories are generally organized in matrices formed by rows and columns of memory cells.

Each memory cell can then be selected by a word line associated with each row and a bit line associated with each column. In practice, for reasons of simplicity, the replacement of a defective memory cell is done by replacing the entire row or column that contains this cell. The memory element (row or column memory element) that has to be replaced will depend on the type of defect detected.

These redundant elements are put into operation following tests carried out after the manufacture of each integrated circuit. To this end, programmable reconfiguration means are provided for in the integrated circuit so that when the test reveals a defective element, this defective element is automatically replaced by a replacement element chosen from among the redundant elements, and this replacement must be invisible and have no effect on the performance characteristics of the memory.

In practice, the reconfiguration means contain circuits to ascertain that the current address present in the memory corresponds to that of a defective element and, if this is the case, these means select a redundant element to replace the defective element.

This automatic replacement is usually done by means of non-volatile programmable registers designed to contain the addresses of the defective elements. In the case of a memory organized in rows and columns, this address will be either the row address or the column address, corresponding respectively to the most significant bits and the least significant bits of the whole address. Up till now, each redundant element has been associated with a register such as this as well as with a comparator receiving the value contained in this register and the current address as inputs. When the testing operations are over, the registers are programmed at values representing the addresses of the defective elements. Thus, during operation, if the current address coincides with the value contained in one of the registers, the associated comparator delivers a signal enabling the automatic selection of the associated redundant element. At the same time, the selection of the defective element is inhibited.

This approach therefore makes it necessary to provide for a number of programmable registers that is equal to the number of redundant elements. Furthermore, it is necessary to program as many registers as there are defective elements detected. Now, the presence of non-volatile programmable registers raises problems of reliability due to the fact that they are difficult to manufacture and to program.

Thus, the invention is aimed at improving reliability by proposing an approach that limits the number of programmable registers, especially when the defective elements are topologically neighboring.

More specifically, an object of the invention is a circuit for the selection of several redundant elements of a memory organized in rows and columns of memory cells, an "element" designating a row or a column, said redundant elements being designed to replace elements comprising defective cells, said elements to be replaced being identified respectively by particular values of a current address used to address said elements, one of said particular values being contained in non-volatile programmable memorizing means, wherein said selection circuit comprises computation means for the computation, as a function of an input value equal to said value contained in said memorizing means, of the address value of at least one other element to be replaced and comparison means to compare said current address with said memorized value and computed address value or values and to give comparison signals resulting from said comparisons, and wherein said comparison signals condition the preparation of signals for the selection of associated redundant elements.

As compared with the prior art approach, the invention has the advantage wherein at least a part of the non-volatile registers is replaced by normal circuits having far greater reliability.

According to a particular embodiment of the invention, the computation means comprise at least one incrementation circuit giving an output value equal to the sum of an input value and an incrementation value (e.g. 2 or 4).

The simplest case is the one where the topological order of the rows and columns of the memory follows that of the numerical values of the corresponding addresses. In this case, to replace several neighboring elements, the computation of the addresses could be done by means of only one incrementation circuit with an incrementation value equal to one. Furthermore, a single incrementation circuit could be shared among several selection circuits. However, it will be appropriate to make provision, whenever the memory is powered, for an initialization stage during which the address values of the elements to be replaced are computed and memorized successively.

If it is desired to prevent this initialization stage, and according to a particular embodiment of the invention, the selection circuit comprises an incrementation circuit associated with each of the other elements to be replaced.

Advantageously, the incrementation circuit is formed by a combination of logic circuit designed to compute the sum of an input value and a fixed incrementation value.

Naturally, for greater flexibility, provision could be made in one and the same memory for several selection circuits whose incrementation circuits are associated with different incrementation values.

One type of defect that occurs frequently is the one where two or more topologically neighboring word lines are short-circuited. Since a defect such as this can also occur for redundant rows, the selection circuit is advantageously designed so that the selection signals that it gives select topologically neighboring redundant rows, the selection circuit then comprising a circuit to inhibit these selection signals. The inter-line defects raise a particular problem in the case of the "FLASH EEPROM" memories for the reasons that shall be explained here below. This type of memory uses, as a memory cell, a particular floating-gate MOS transistor whose conduction threshold is modifiable by the application of appropriate voltages to its electrodes. The programming of a cell consists in creating a high threshold (for example 6 volts) by the application of programming voltages to the gate (for example 12 volts) and to the drain (for example 6 volts), the source being grounded.

This programming is selective and controlled for each transistor of the memory. By convention, it will be said that a programmed cell memorizes the logic 0 value. The erasure of a cell consists in creating a low threshold (for example 2 volts) by the application of an erasure voltage (for example 10 volts) to the source of the transistor, its gate being grounded and its drain being placed in the state of high impedance. Contrary to the programming, an erasure operation is total. This means that it is applied to all the cells of the memory or of a whole sector if the memory is organized in several independent sectors. With the above convention, an erased cell memorizes the logic 1 value. The reading of a cell consists in detecting its state of conduction. For this purpose, a reading voltage (of 5 volts for example) is applied to its gate and the current flowing in the cell is compared to that flowing in a reference cell.

Owing to the total nature of the erasure, it is necessary to carry out a preliminary controlled programming of each cell of the sector considered so as to limit drifts and variations of the threshold values after the total erasure. This pre-erasure programming is done by the performance of a specific algorithm which activates the addressing and controls the programming of each of the cells of the sector. Naturally, these operations can be applied also to the redundant cells and possibly to the defective cells.

The programming of a given cell consists in selecting the row to which it belongs by applying the programming voltage of the gates to the associated word line. Furthermore, the column of this cell is selected by applying the programming voltage of the drains to the corresponding bit line. The other rows and columns are not selected. The consequence of this, in particular, is that the other word lines are connected to the ground. Thus, if several word lines are short-circuited (these are most usually two topologically neighboring lines), the pre-erasure programming of the cells belonging to the corresponding rows is not done normally and there is a risk that the thresholds obtained after erasure might be too low (depleted cells). This problem will be prevented if provision is made for selecting the short-circuited word lines simultaneously when the pre-erasure programming operations are carried out.

According to a particular aspect of the invention, this simultaneous selection applied to the topologically neighboring redundant rows could easily be done by arranging for the computation means of the selection circuit to be controllable so as to selectively provide a value identical to its input value.

An object of the invention is also an electrically erasable programmable memory of the FLASH EEPROM type comprising a plurality of selection circuits as defined here above.

BRIEF DESCRIPTION OF THE DRAWING

The disclosed inventions will be described with reference to the accompanying drawings, which show important sample embodiments of the invention and which are incorporated in the specification hereof by reference, wherein.

Other aspects and advantages of the invention will appear from the following description, made with reference to the figures.

DETAILED DESCRIPTION OF THE PREFERRED EMBODIMENTS

Figure 1:
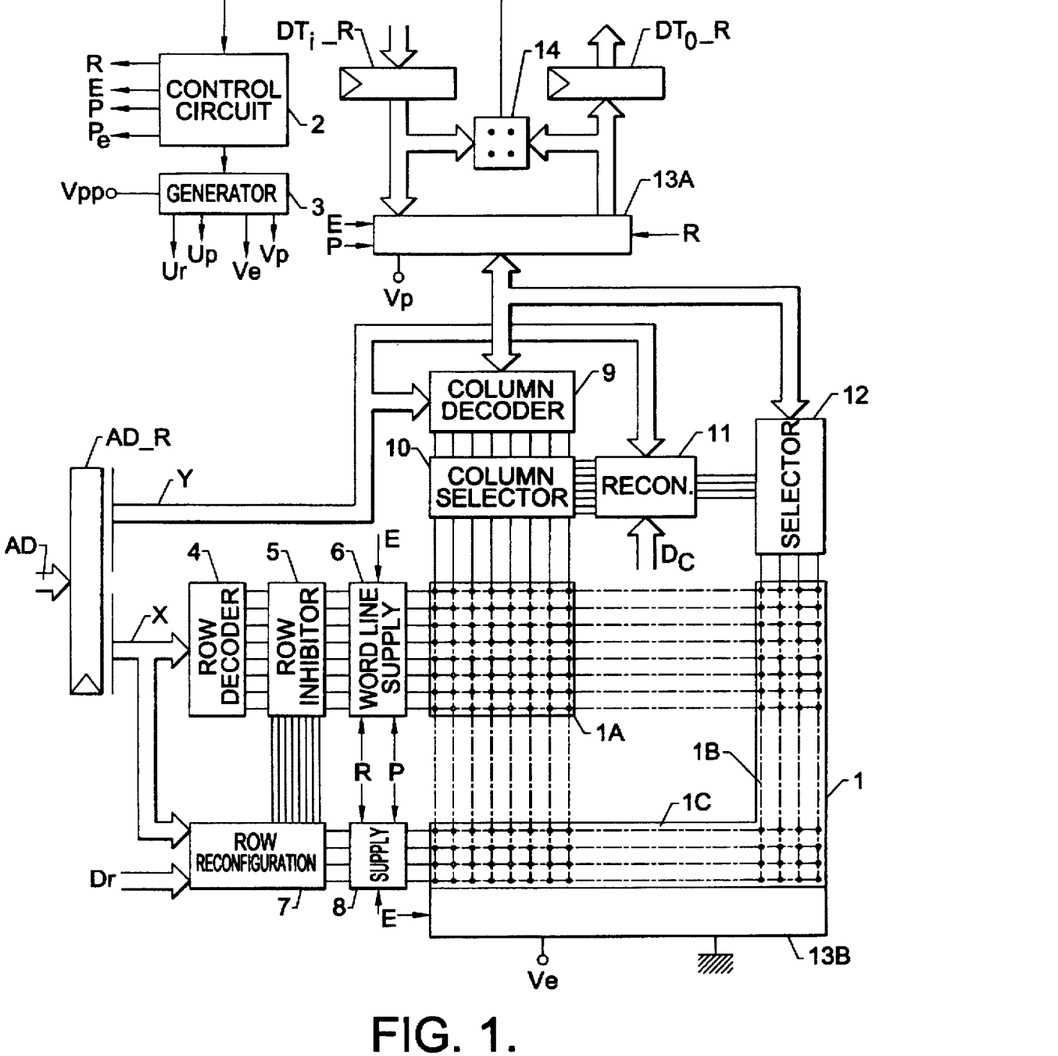
FIG. 1 is a general diagram of a memory comprising redundant elements.

The numerous innovative teachings of the present application will be described with particular reference to the presently preferred embodiment (by way of example, and not of limitation), in which:

FIG. 1 shows the main constituent elements of a memory in which it is possible to use selection circuits according to the invention. As a non-restrictive example, the memory shown is of the FLASH EEPROM type.

Apart from the interface and maintenance circuits (not shown), the memory is essentially formed by a matrix 1 of memory cells organized in rows and columns, a control circuit 2 and a generator 3 of supply voltages. The control circuit 2 is a programmed unit, for example of the PLA type, that controls all the circuits of the memory such as for example the generator 3. The main role of the circuit 2 is that of controlling the reading, erasing and programming operations by means of control signals R, E, P or Pe transmitted to the different circuits involved.

The generator 3 is responsible for the provision, from the external supply and programming voltages Vpp, of the different potentials Ur, Up, Vp, Ve needed for the reading, programming and erasure operations.

The memory is addressed by a current address AD received from the exterior and loaded by the interface circuit into an address register AD-R. The data elements exchanged with the exterior go through by means of an input data register DTi-R for writing and an output data register DTo-R for the reading. The most significant bits X of the address AD constitute the row address which will be used to define the row to be selected during a reading or writing operation. The least significant bits Y of the address AD constitute the column address used to define the column to be selected.

The matrix 1 has a main matrix as well as a set of redundant rows 1C and a set of redundant columns 1B. These redundant rows and columns are designed to replace rows and columns in which cells are recognized as being defective during the testing operations.

In a standard way, the rows of the main matrix can be selected as a function of the row address X by means of a row decoder 4 which gives selection signals to a supply and amplification circuit 6 through an inhibition circuit 5. The amplification circuit 6 is designed for the application, to the word lines of the matrix 1A, of the appropriate voltages for the reading, erasure or programming operations. The row inhibition circuit 5 is aimed at deactivating the defective rows selected by a row reconfiguration circuit 7.

The circuit 7 which shall be described in greater detail with reference to FIG. 2 also plays the role of a circuit for the selection of the redundant rows 1C and controls an amplification circuit 8 used to supply the word lines associated with these rows in a manner similar to the circuit 6.

The columns of the main matrix are selected as a function of the column address Y by means of a column decoder 9 connected to a column selection circuit 10 controlled by a column reconfiguration circuit 11. The circuit 11 also controls a circuit 12 for the selection of the redundant columns 1B. The selection circuits 10, 12 give selection signals that condition the application of appropriate voltages to the corresponding bit lines during the reading or writing operations. These voltages are given by the circuits 13A and 13B under conditions that shall be described in greater detail with reference to FIG. 3. The circuit 13A further comprises amplification means for the reading. In order to enable the simultaneous reading and writing of several bits of one and the same word associated with several columns, there is provision generally for several reading amplifiers and several writing circuits working in parallel.

A comparator 14 is connected at input to the read amplifiers and to the input data register DTi-R so as to inform the control circuit 2 that the memory cell programming operations are going ahead as required. The result of this comparison is taken into account by the control circuit 2 to match the performance of its programming algorithm.

Figure 2:
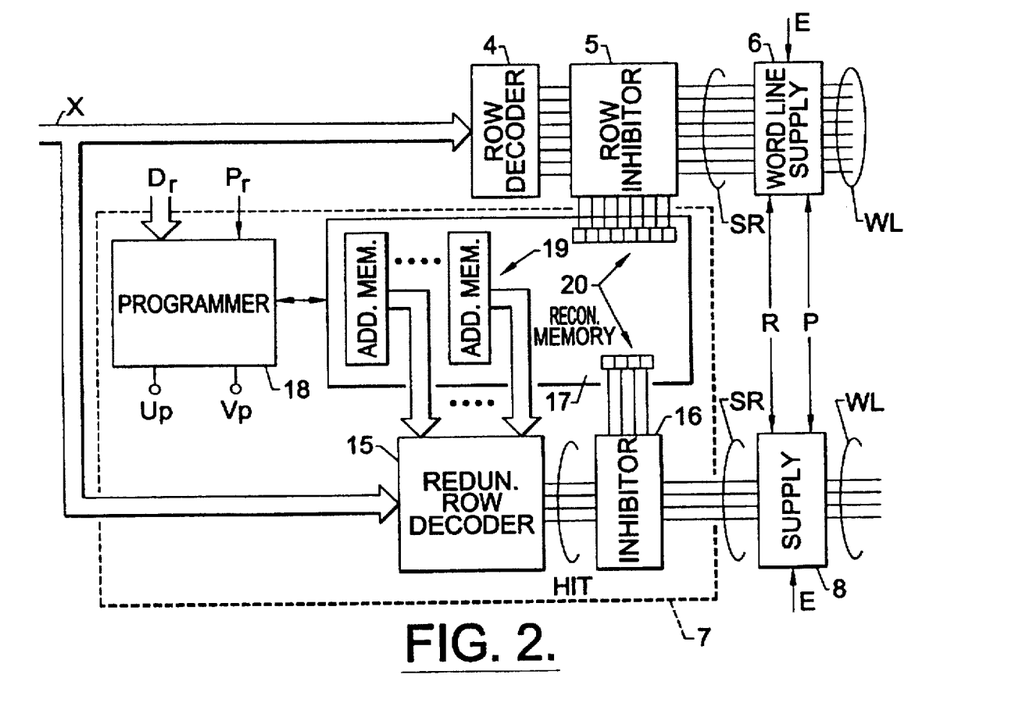
FIG. 2 shows means for the selection of the rows of the memory of FIG. 1.

FIG. 2 shows all the means of selection of the rows of the matrix 1 and shows the reconfiguration circuit 7 in greater detail. The circuit 7 has a reconfiguration memory 17 essentially formed by an address memory 19 and invalidation cells 20. These memory elements are formed by means of non-volatile cells associated with reading means (not shown). These cells are furthermore programmable by a programming circuit 18. The address memory 19 is formed by a plurality of registers, each designed to contain a particular row address value corresponding to a defective row of the main matrix 1A. The invalidation cells 20 are respectively associated with the rows of the matrix 1 and their logic states constitute indicators of the inhibition of the associated rows. The programming of the elements 19 and 20 by the circuit 18 is done in response to a programming command Pr as a function of reconfiguration data elements Dr delivered by the maintenance circuits of the memory.

The state of the invalidation cells of the rows of the main matrix 1A are transmitted to the inhibition circuit 5 mentioned here above. The circuit 5 gives the row selection signals SR to the supply circuit 6 of the word lines WL. The redundant rows are selected by means of a decoder 15 and an inhibition circuit 16 advantageously formed by means of selection circuits according to the invention. The decoder 15 receives, at input, the current row address X as well as the particular address values contained in the address memory 19. As a function of these data elements, the decoder 15 gives the inhibition circuit 16 comparison signals HIT which form signals for the preselection of the redundant rows. As in the case of the main matrix, the inhibition circuit 16 receives the inhibition indicators representing states of the invalidation cells associated with the redundant rows and gives the corresponding selection signals SR. As in the case of the main matrix, the signals SR control the supply circuit 8 of the word lines WL.

The programming of the reconfiguration memory 17 is based on the following principle. Initially, all the invalidation cells 20 and the cells constituting the address memory 19 are erased. When a row of the main matrix is detected as being defective, its invalidation cell is programmed. The particular value of the address of this row is then loaded into one of the registers of the address memory 19 by a selective programming of the cells of this register. Additionally, a reserved cell of this register is programmed so as to constitute an indicator of validity of the associated address. This particular address value will then be used by the decoder 15 in the way that shall be described here below with reference to FIG. 4. If it turns out that one of the redundant rows thus put into operation is itself defective, its invalidation cell is then programmed so as to inform the inhibition circuit 16.

As a variant, the invalidation cells of the rows of the main matrix can be eliminated on condition that provision is made for a total inhibition of all the rows of the main matrix, this total inhibition being prompted by the activation of any one of the comparison signals HIT.

The column selection means can be made in a way that is quite similar to that of the above diagram. Hence no specific description shall be given thereof.

Figure 3:
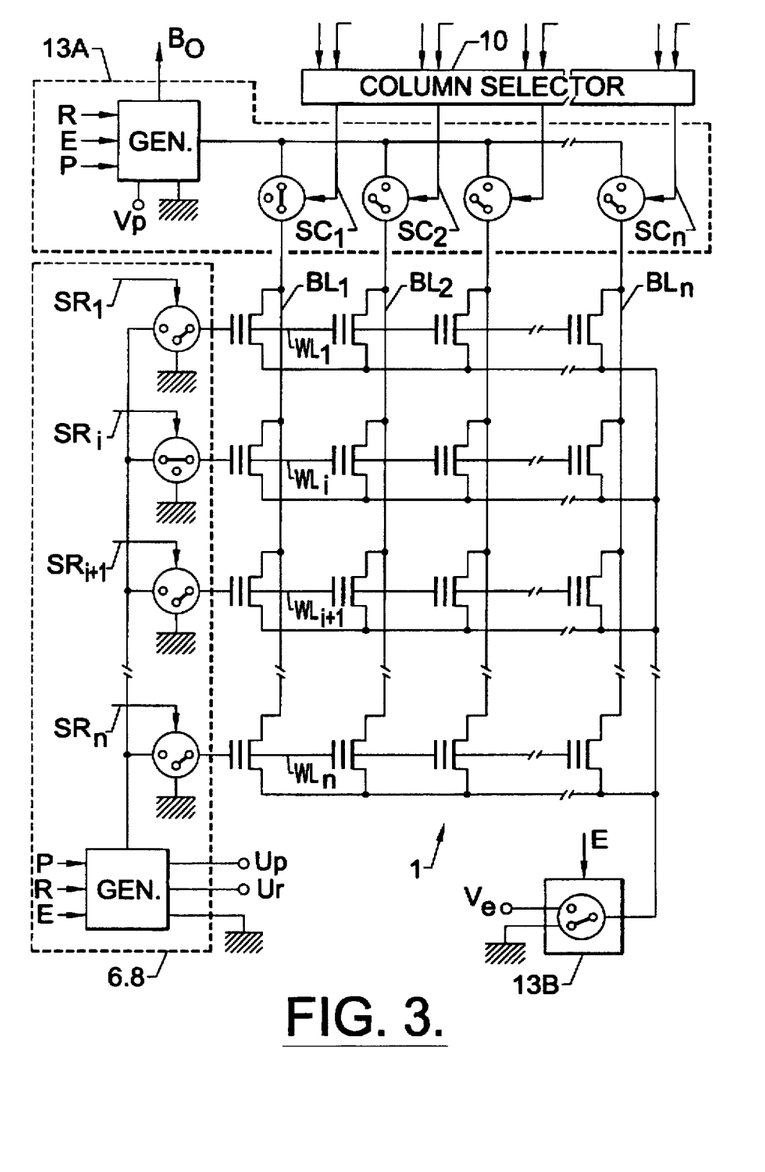
FIG. 3 shows a matrix of memory cells using floating-gate transistors.

Before giving a more detailed explanation of the selection circuit according to the invention, it is necessary to recall the structure and organization of the matrices of floating-gate transistors used in the FLASH EEPROM type memories. FIG. 3 shows a structure such as this in a simple case of access by words of only one bit. The case of access by words of several bits can easily be deduced therefrom.

The sources of the transistors are all connected to one another and are supplied by a supply circuit of the sources 13B giving the ground potential during the reading and programming operations or else an erasure potential Ve (of the order of 10 volts) during the erasure operations. Each row is activated by a word line WL1, . . . WLi, WLi+1, . . . WLn connected to each of the control gates of the transistors of the row. The word lines are supplied by a supply circuit 6, 8 controlled by the row selection signals SR1, . . . SRi, SRi+1, . . . SRn. For the non-selected rows, such as the first row, the supply circuit 6, 8 applies the ground potential to the associated word lines. For the selected row (row i), the circuit 6, 8 applies the following to the corresponding word line WLi: the potential Up (of the order of 12 volts) in the case of a programming operation, the potential Ur (of the order of 5 volts) in the case of a reading operation or the ground potential in the case of an erasure. The drains of the transistors of each column are connected to an associated bit line BL1, BL2, . . . , BLn. These bit lines are connected to the reading and writing circuit 13A controlled by the column selection signals SC1, SC2, . . . , SCn given by the column selection circuit 10. The bit lines of the unselected columns are placed in the high impedance state while that of the selected column (the first column) is connected to a read amplifier giving a binary data element Bo in the case of a reading operation or else receives a programming potential Vp (of the order of 6 volts) in the case of a programming operation or else is placed in the high impedance state in the case of an erasure.

In the foregoing description, it may be noted that the reading and progranmming operations are selected for each transistor of the matrix whereas the erasure operations relate to all the transistors. For the reasons indicated here above, the total character of the erasure operations calls for a preliminary programming of each of the transistors of the matrix. The programming of one of these transistors therefore implies the application, to its word line (for example WLi), of the programming potential Up, its drain being supplied by the voltage Vp. Furthermore, the other word lines (for example WLi+1) are normally connected to the ground. Now, if the selected word line WLi is poorly insulated and is short-circuited with another word line, generally a neighboring line, it does not receive an appropriate programming potential. The result thereof is that the transistors of the two rows whose word lines are short-circuited will be badly programmed (excessively low conduction threshold) and there is a risk that, after total erasure, they will be depleted (negative voltage threshold) and will therefore be conductive even if they are not selected.

The result thereof is the risk that the voltage present at a bit line during a reading operation might no longer represent the state of conduction of the selected transistor. To overcome this problem, the solution consists in dictating a parallel programming of the transistors of the rows having their word lines short-circuited. This may be done by the modifying, accordingly, of the working of the last stage of the word decoder. Here below, we shall see how this modification can be obtained simply by means of the selection circuit according to the invention which shall now be described in greater detail with reference to FIG. 4.

Figure 4:
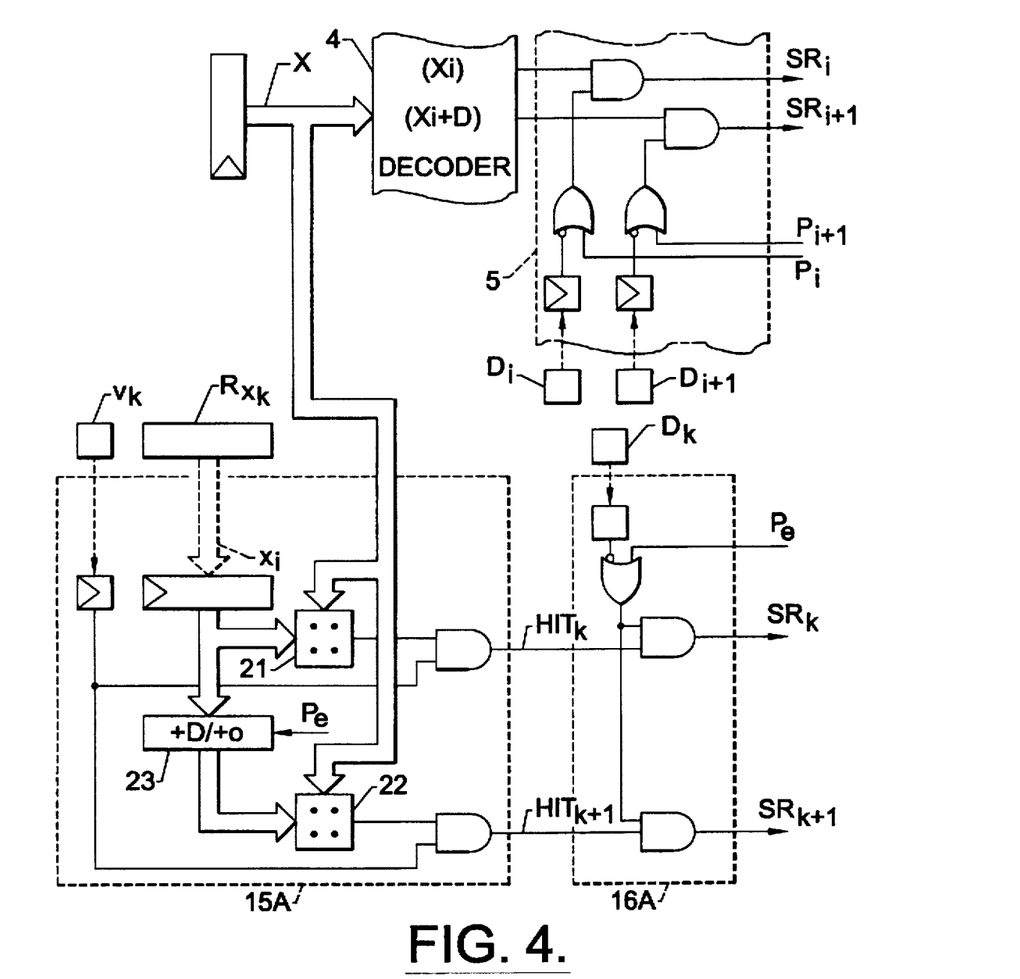
FIG. 4 is a detailed drawing of a selection circuit according to the invention.

The selection circuit is essentially constituted by a decoder of redundant rows 15A and an inhibition circuit 16A. To simplify the explanation, the circuit shown in FIG. 4 is designed to select only two topologically neighboring redundant rows (k, k+1) that can be selected by the signals SRk and SRk+1. As a complement, the FIG. 4 also shows those parts of the decoder 4 and of the inhibition circuit 5 that relate to two rows (i, i+1) of the main matrix that can be selected by the signals SRi and SRi+1.

The decoder 15A of the selection circuit has a first comparator 21 receiving, at input, the current row address X and the particular row address value contained in the register RXk of the address memory 19. This particular value is, for example, the address Xi of the row i of the main matrix. To simplify the logic of the decoder 15A, the register RXk has a cell vk whose logic state is used to indicate the validity of the data elements contained in the register RXk. The particular value Xi is furthermore applied to the input of computation means 23 capable of computing the sum of its input value and an incrementation value D.

A second comparator 22 receives the current address X and the value computed by the computation means 23 as inputs. Thus, when the particular value contained in the register RXk is validated by the state of the cell vk, the comparison circuits 21 and 22 respectively give comparison signals HITk and HITk+1 transmitted to the inhibition circuit 16A. Provided that the invalidation indicator Dk associated with the redundant rows k and k+1 is inactive, the signals HITk and HITk+1 respectively are the signals SRk and SRk+1 for the selection of the redundant rows k and k+1.

Thus, by choosing the difference between the addresses of two rows (for example the neighboring rows i and i+1) of the main matrix as the incrementation value D, the selection circuit will select the redundant rows k and k+1 respectively instead of the rows i and i+1 of the main matrix. Naturally, the rows i and i+1 will have been deactivated beforehand by the programming of the corresponding invalidation indicators Di and Di+1.

In cases of a scrambled mapping, where physical addresses differ from logical addresses, the incrementation value D may be 2 or 4, or dependant from a more complex scrambling function. In these cases, the incrementation value will be stored in a non-volatile register, with the configuration of scrambling parameters. This is the case for highly secured chips. In simple cases, the incrementation value will generally be one. When this happens (D=1), the invention reduces to replacement of defective pairs of adjacent rows or columns by a pair of redundant rows or columns.

As explained here above, a short circuit between two (neighboring) word lines calls for a parallel pre-erasure programming operation. It is therefore appropriate to plan for this case by permitting the activation of the selection signals despite the invalidation indicators. For the rows of the main matrix, this authorization may be obtained by means of pre-erasure programming signals Pi and Pi+1 according to the diagram of the inhibition circuit 5 shown in the figure.

With regard to the redundant rows, the pre-erasure parallel programming can be done more simply be arranging for the computation means 23 to be controllable controlled by a signal Pe so that they give an output value that is identical to the input value. Thus, when the signal Pe is active, the appearance of a current address X equal to the particular value Xi prompts the simultaneous activation of the comparison signals HITk and HITk+1. Thus, since the invalidation indicator Dk is deactivated by the signal Pe, the rows k and k+1 will be selected simultaneously by the selection signals SRk and SRk+1 which are simultaneously active. Naturally, this possibility of simultaneous selection of several rows is useful above all when these rows are topologically neighbors because short-circuiting between distant lines is far more improbable.

The embodiment that has just been described is naturally not exhaustive. A great many variants within the scope of those skilled in the art can be provided thereto. In particular, the selection circuit could be modified for the selection of the additional rows by providing for other computation means and other comparators. It is also possible to share the computation means among several comparators of one and the same selection circuits or several different selection circuits by appropriate multiplexing means which will be activated during an initialization stage after each instance in which the memory is powered.

Figure 5:
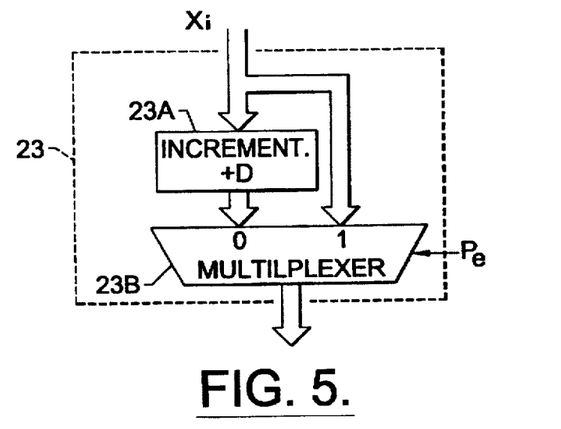
FIG. 5 shows an exemplary embodiment of the computation means for the implementation of the invention.

According to the diagram of FIG. 5, the computation means may advantageously be formed by means of an incrementation circuit 23A constituted by a wired logic circuit designed to give a fixed implementation value. This circuit 23A will then be associated with a multiplexer 23B controlled by the signal Pe according to the diagram shown in the figure.

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown. In an alternate embodiment, the incrementation can optionally be performed on only the row bits or only the column bits.

What is claimed is:

1. An integrated circuit memory, comprising:

an array of FLASH EEPROM memory cells, organized in rows and columns;

a plurality of redundant portions, each parallel to rows or columns of said array;

a nonvolatile memory storing defective address identifiers;

row and column selection logic, connected to access one of said rows and one of said columns as selected by externally received address bits, to thereby select one or more of said memory cells; and redundancy selection logic, connected to said nonvolatile memory storing defective address identifiers, selectably operable in two modes;

wherein, in a first mode, said redundancy selection logic, whenever the externally received address bits match one of said defective address identifiers in said nonvolatile memory, inactivates a portion of said array whose address corresponds to said defective address identifier, and also activates one of said redundant portions;

wherein, in said first mode, said redundancy selection logic, whenever the externally received address bits match one of said defective address identifiers in said nonvolatile memory plus a predetermined increment value, inactivates a portion of said array whose address matches said defective address identifier plus said predetermined increment value, and also activates one of said redundant portions;

wherein, in a second mode, said redundancy selection logic activates two topologically adjacent ones of said redundant portions for each accessed address.

2. An integrated circuit memory as in claim 1, wherein said array of memory cells comprises at least 16 megabits of memory.

3. An integrated circuit memory as in claim 1, wherein said predetermined increment value is 2.

4. An integrated circuit memory as in claim 1, wherein said predetermined increment value corresponds to the address difference between topologically adjacent elements.

5. A method of operating an integrated circuit memory, comprising the steps of a) providing an integrated circuit memory comprising an array of FLASH EEPROM memory cells, organized in rows and columns, a plurality of redundant portions, each parallel to rows or columns of said array, a nonvolatile memory storing defective address identifiers, row and column selection logic, connected to access one of said rows and one of said columns as selected by externally received address bits, to thereby select one or more of said memory cells, and redundancy selection logic, connected to said nonvolatile memory storing defective address identifiers, said redundancy selection logic being operable in two modes;

b) in a first mode,
i) when the externally received address bits match one of said defective address identifiers in said nonvolatile memory, inactivating a portion of said array whose address corresponds to said defective address identifier, and also activates one of said redundant portions;

ii) when the externally received address bits match one of said defective address identifiers in said nonvolatile memory plus a predetermined increment value, inactivates a portion of said array whose address matches said defective address identifier plus said predetermined increment value, and also activates one of said redundant portions, and c) in a second mode, when the externally received address bits match one of said defective address identifiers in said non-volatile memory, activating two topologically adjacent ones of said redundant portions.

6. An integrated circuit memory as in claim 3, wherein said array of memory cells comprises at least 16 megabits of memory.

7. A method of operating an integrated circuit memory as in claim 3, wherein said predetermined increment value is 2.

8. An integrated circuit memory as in claim 3, wherein said predetermined increment value corresponds to the address difference between topologically adjacent elements.

9. A circuit for the selection of several redundant elements of an electrically erasable memory of the FLASH EEPROM type organized in rows and columns of memory cells, an "element" designating a row or a column, said redundant elements being designed to replace elements comprising defective cells, said elements to be replaced being identified respectively by particular values of a current address used to address said elements, one of said particular values being contained in non-volatile programmable memorizing means, wherein said selection circuit comprises:

computation means for the computation, as a function of an input value equal to said value contained in said memorizing means, of the address value of at least one other element to be replaced, and comparison means to compare said current address with said memorized value and computed address value or values and to give comparison signals resulting from said comparisons, wherein said comparison signals condition the preparation of signals for the selection of associated redundant elements; and wherein said computation means are controllable so as to selectively provide a value identical to its input value.

10. A selection circuit according to claim 9, wherein said computation means comprise at least one incrementation circuit giving an output value equal to the sum of an input value and an incrementation value.

11. A selection circuit according to claim 9, comprising an incrementation circuit associated with each of said other elements to be replaced.

12. A selection circuit according to claim 9, wherein said incrementation circuit is formed by a combination of logic circuit designed to compute the sum of an input value and a fixed incrementation value.

13. A selection circuit according to claim 9, wherein said selection signals select topologically neighboring redundant rows and wherein said selection circuit comprises a circuit for the inhibition of said selection signals.

14. An electrically erasable programmable memory of the FLASH EEPROM type, comprising at least one selection circuit according to claim 9, wherein each stored value is associated with an invalidation indicator contained in a programmable, non-volatile memory cell, wherein when said invalidation indicator is in a first logic state, said selection signals are identical respectively to said comparison signals, wherein when said invalidation indicator is in a second logic state, said selection signals are inhibited except when an operation for the pre-erasure programming of the memory is carried out, in which case said computation means are controlled to give a value identical to said input value.

* * * * *

UNITED STATES PATENT AND TRADEMARK OFFICE
CERTIFICATE OF CORRECTION

PATENT NO. : 5,796,653
DATED : August 18, 1998
INVENTOR(S) : Jean-Marie Gaultier It is certified that error appears in the above-identified patent and that said Letters Patent is hereby corrected as shown below:

Column 10, Line 1     Strike:
       " An integrated circuit memory as in claim 3, "

Insert:
        -- A method of operating an integrated circuit memory as in claim 5, --

Column 10, Line 5     Strike:
        " claim 3, "

Insert:
        -- claim 5, --

Column 10, Line 6     Strike:
        " An integrated circuit memory as in claim 3, "

Insert:
        -- A method of operating an integrated circuit memory as in claim 5, --

UNITED STATES PATENT AND TRADEMARK OFFICE
CERTIFICATE OF CORRECTION

PATENT NO. : 5,796,653
DATED : August 18, 1998
INVENTOR(S) : Jean-Marie Gaultier It is certified that error appears in the above-identified patent and that said Letters Patent is hereby corrected as shown below:

Column 10, Line 22    Strike:
    " other element to be replaced, and "

Insert:
    -- other element to be replaced; and --

Column 10, Line 26    Strike:
    " said comparisons, "

Insert:
    -- said comparisons; --

Signed and Sealed this

Fifth Day of January, 1999

Attest:

Attesting Officer

*Acting Commissioner of Patents and Trademarks*